United States Patent [19]

Haferl

[11] 4,096,415
[45] Jun. 20, 1978

[54] SWITCHED VERTICAL DEFLECTION CIRCUIT
[75] Inventor: Peter Eduard Haferl, Adliswil, Switzerland
[73] Assignee: RCA Corporation, New York, N.Y.
[21] Appl. No.: 783,217
[22] Filed: Mar. 31, 1977
[30] Foreign Application Priority Data
Apr. 26, 1976 United Kingdom ............... 16869/76
[51] Int. Cl.² ............................................ H01J 29/72
[52] U.S. Cl. ..................................... 315/393; 315/408
[58] Field of Search ................. 315/399, 408, 410, 393
[56] References Cited
U.S. PATENT DOCUMENTS
3,452,244  6/1969  Dietz .................................... 315/408

Primary Examiner—Maynard R. Wilbur
Assistant Examiner—T. M. Blum
Attorney, Agent, or Firm—Eugene M. Whitacre; Paul J. Rasmussen; Joseph Laks

[57] ABSTRACT

In a switched vertical deflection circuit, two SCR switches couple horizontal retrace pulses to a capacitor. A modulator couples pulse width modulated gating pulses to the SCR's. The SCR's couple to the capacitor successively smaller portions of the horizontal retrace pulses during a first part of the vertical trace interval and successively larger portions during a second part for developing in a vertical deflection winding a sawtooth vertical deflection current. The modulator couples gating pulses to one of the SCR's during the vertical retrace interval for substantially loading the horizontal deflection circuit during the vertical retrace interval for preventing undesired oscillations within the horizontal deflection circuit.

10 Claims, 8 Drawing Figures

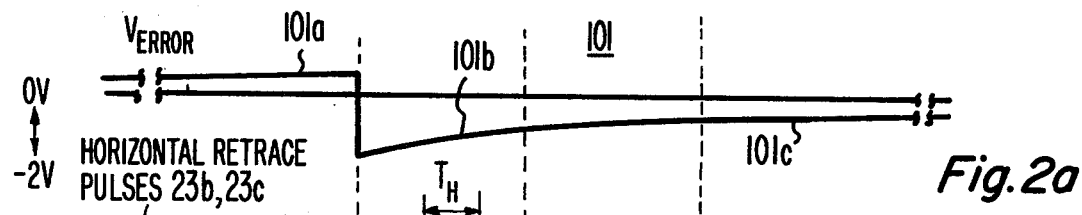
Fig.2a
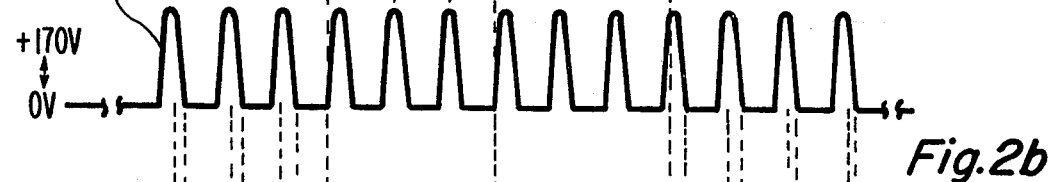
Fig.2b
Fig.2c
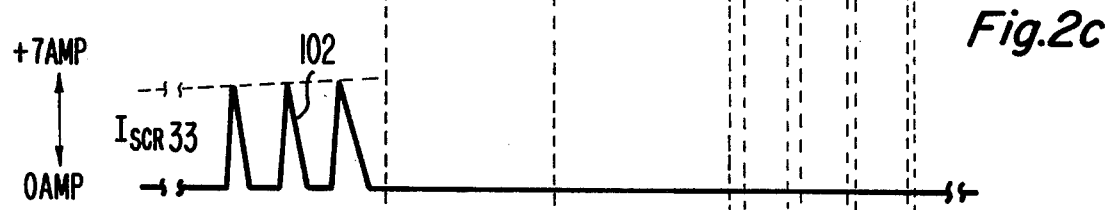
Fig.2d
Fig.2e
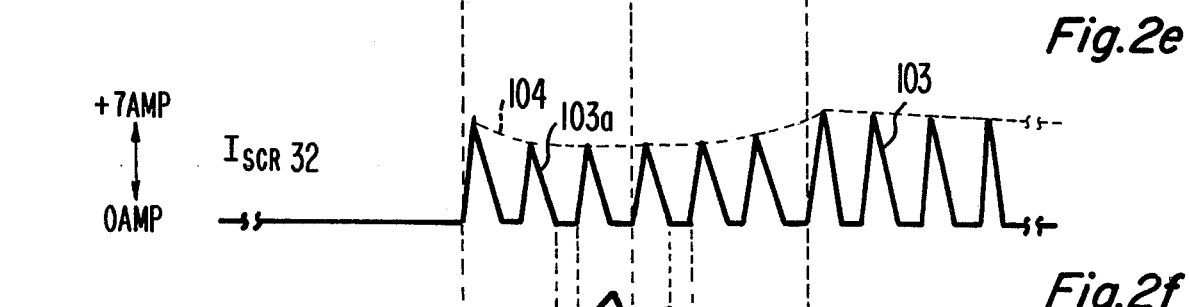
Fig.2f
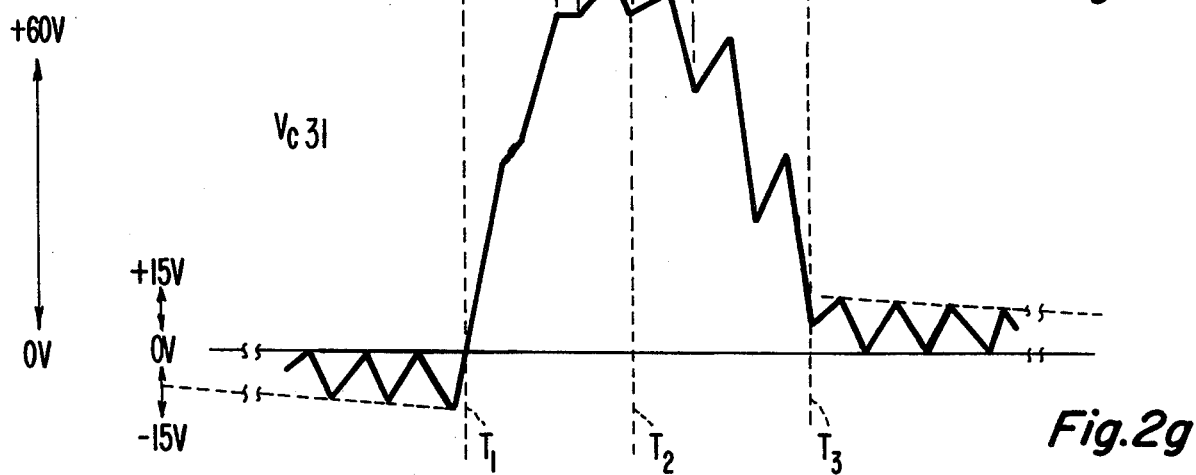
Fig.2g

SWITCHED VERTICAL DEFLECTION CIRCUIT

BACKGROUND OF THE INVENTION

This invention relates to switched vertical deflection circuits for a television receiver.

In a switched vertical deflection circuit of the type disclosed in U.S. Patent Application Ser. No. 595,809, now U.S. Pat. No. 4,048,544, filed July 11, 1975, by Peter Eduard Haferl, entitled, SWITCHED VERTICAL DEFLECTION SYSTEM, horizontal rate energy, in the form of horizontal retrace pulses from a horizontal output transformer of a horizontal deflection circuit, charges a capacitor in parallel with a vertical deflection winding. A first switch, such as an SCR, couples successively smaller portions of the horizontal rate energy to the capacitor during a first part of the vertical trace interval and a second switch, such as another SCR, couples successively larger portions of the horizontal rate energy during a second part of the vertical trace interval. The voltage across the capacitor is integrated by the vertical deflection winding into a sawtooth vertical deflection current. The conduction of the two SCR switches is controlled by horizontal rate pulse width modulated pulses coupled from a modulator to the SCR gate electrodes.

At the start of vertical retrace, the second SCR switch which had previously been conducting is maintained in cutoff. The vertical deflection winding and the capacitor form a resonant retrace circuit. A disconnect diode coupled to the gate of the first SCR switch is reversed biased, maintaining the SCR in cutoff independent of the gating pulses generated by the modulator. With both SCR's nonconducting, resonant retrace of the current in the vertical deflection winding is accomplished. At the start of the subsequent vertical trace interval, the disconnect diode is no longer reverse biased. Pulse width modulated gating pulses to the first SCR enable the SCR to couple the horizontal retrace pulses to the capacitor for generating the sawtooth deflection current in the vertical deflection winding.

Both SCR's conduct relatively large amounts of current at the beginning and end of the vertical trace interval, respectively. Neither SCR conducts during the vertical retrace interval. Accordingly, loading of the horizontal deflection circuit by the switched vertical deflection circuit will be greatest at the beginning and end of the vertical trace interval, with substantially no loading occurring during the vertical retrace interval. Such load interruption during the vertical retrace interval may cause undesirable modulation of the horizontal deflection current and undesirable oscillations within the horizontal deflection circuit. These oscillations may appear, for example, in the "S" shaping capacitor or in the horizontal output transformer windings as the load impedance of the vertical deflection circuit abruptly changes. It is, therefore, desirable to provide a switched vertical deflection circuit in which undesirable oscillations within the horizontal deflection circuit are prevented.

SUMMARY OF THE INVENTION

A switched vertical deflection circuit comprises a horizontal deflection circuit including apparatus for generating horizontal rate energy signals, a vertical deflection winding, an energy storage capacitance, first and second switches and a switching circuit coupled to the switches. The switching circuit switches the conductive states of the switches for coupling successively smaller portions of the horizontal rate energy signals to the energy storage capacitance during a first part of the vertical trace interval and successively larger portions during a second part for developing a vertical deflection current in the vertical deflection winding during the vertical trace interval. The switching circuit causes the first switch to conduct during the vertical retrace interval for coupling substantial portions of the horizontal rate energy signals to the energy storage capacitance during the vertical retrace interval for preventing undesired oscillations within the horizontal deflection circuit.

BRIEF DESCRIPTION OF THE DRAWING

FIGS. 2a – 2g illustrate waveforms associated with the circuit of FIG. 1.

DESCRIPTION OF THE INVENTION

Figure 1:
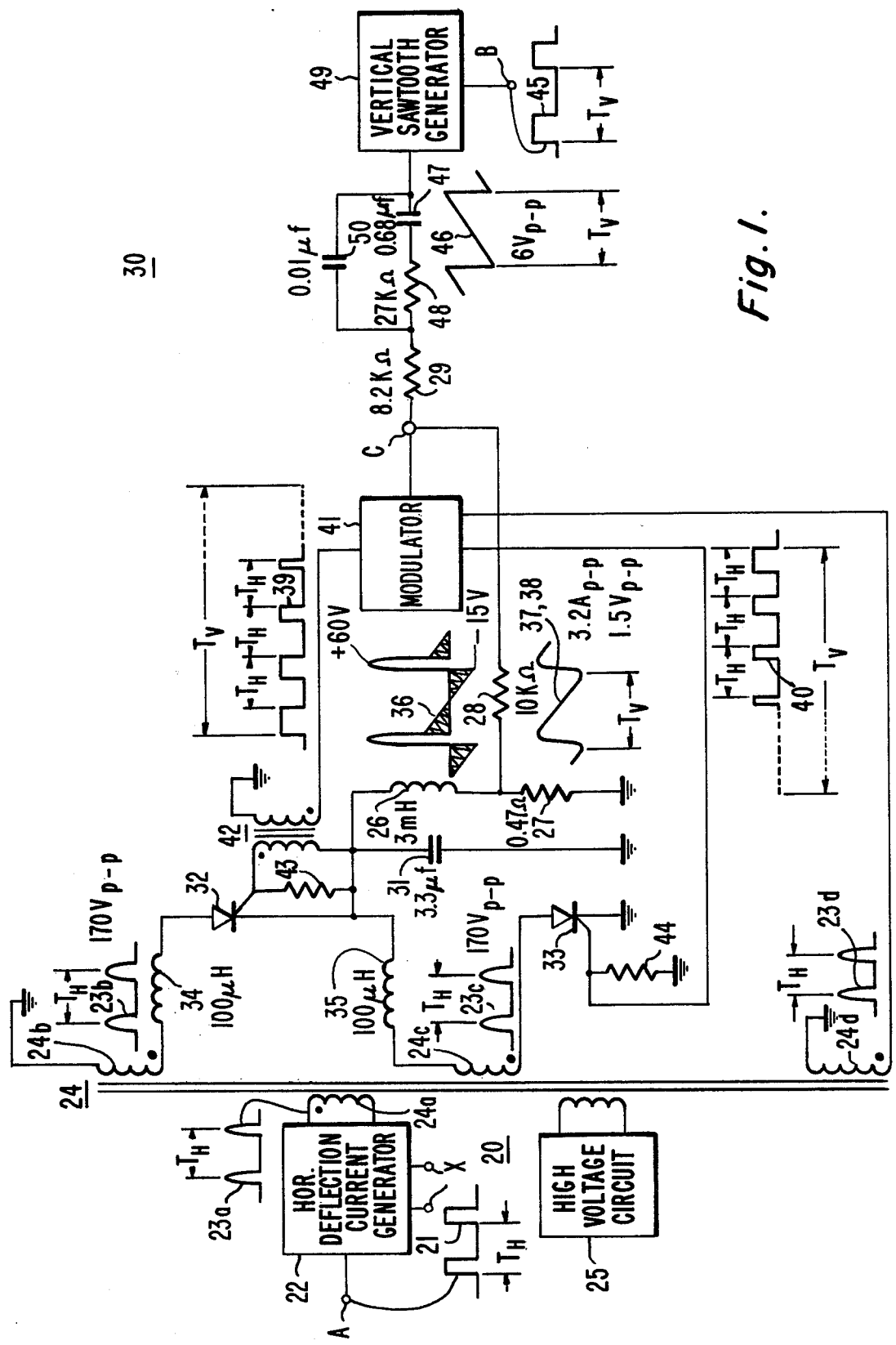
FIG. 1 illustrates a switched vertical deflection circuit embodying the invention.

In FIG. 1, horizontal sync pulses 21, repeating at a frequency $1/T_H$, obtained from a sync separator, not shown, are coupled to a terminal A of a horizontal deflection circuit 20. Horizontal deflection circuit 20 includes a horizontal deflection current generator 22 for generating a horizontal sawtooth deflection current in a horizontal deflection winding, not shown, coupled to terminals X—X. Horizontal deflection current generator 22 may be of conventional design and may include horizontal oscillator and driver stages and either a transistorized or SCR horizontal output stage. Horizontal retrace pulses 23a are developed in a primary winding 24a of a horizontal output transformer 24 and are coupled to a conventional high voltage circuit 25 for providing the ultor voltage to a kinescope, not shown.

Secondary windings 24b and 24c of transformer 24 couple horizontal rate energy in the form of horizontal retrace pulses 23b and 23c to a switched vertical deflection circuit 30 embodying the invention. Switched vertical deflection circuit 30 includes a vertical deflection winding 26, a feedback resistor 27, and a capacitor 31. Horizontal retrace pulses 23b and 23c are coupled to capacitor 31 by means of respective first and second switches comprising SCR 32 and SCR 33 through storage inductors 34 and 35, respectively.

During a first part of the vertical trace interval, successively smaller portions of horizontal rate energy, that is, horizontal retrace pulses 23b, are coupled through inductor 34 and SCR 32 to charge capacitor 31 positively at a horizontal rate, the voltage across capacitor 31 having a decreasing envelope, as illustrated by waveform 36 of FIG. 1. During a second part of the vertical trace interval, successively larger portions of horizontal rate energy, that is, horizontal retrace pulses 23c, are coupled through inductor 35 and SCR 33 to charge capacitor 31 negatively. Vertical deflection winding 26 is responsive to the voltage across capacitor 31, and a sawtooth vertical deflection current 37 flows in deflection winding 26. Waveform 37 also represents the feedback voltage waveform 38 developed across feedback resistor 27.

The conduction of SCR 32 and 33 within each vertical deflection cycle is synchronized with the occurrence of horizontal retrace pulses 23b and 23c by horizontal rate pulse width modulated pulses 39 and 40 coupled to the respective SCR gate electrodes from a modulator 41. Pulses 40 are coupled directly to the gate of SCR 33, while pulses 39 are coupled through a transformer 42, the secondary winding of which is coupled across the gate and cathode of SCR 32. Load resistors 43 and 44 are coupled to the gates of SCR 32 and 33, respectively.

In response to vertical sync pulses 45 obtained from a sync separator, not shown, and coupled to a terminal B, a vertical sawtooth generator 49 produces a vertical sawtooth voltage 46 repeating at a frequency $1/T_V$. Vertical sawtooth voltage 46 is coupled through a capacitor 47, a resistor 48 and a resistor 29 to an input terminal C of modulator 41. The feedback voltage 38 is also coupled to input terminal C through a resistor 28. Both voltages combine to form a vertical sawtooth component of an error voltage coupled to modulator 41 at input terminal C.

The error voltage and horizontal retrace pulses 23d obtained from a secondary winding 24d of transformer 24 are used by modulator 41 to produce the appropriately synchronized and pulse width modulated pulses 39 and 40. As illustrated in FIG. 2a towards the end of a vertical trace interval, prior to time $T_1$, the beginning of the vertical retrace interval, the error voltage 101 is an increasingly positive sawtooth voltage 101a. Modulator 41 provides horizontal rate gating pulses 40 of FIG. 2c of increasing width, and, as shown in FIGS. 2b and 2d, SCR 33 conducts increasingly earlier within each horizontal retrace interval. Increasing current pulses 102 flow through SCR 33 to charge capacitor 31 negatively, as shown in FIG. 2g.

Similarly, during a first portion of the next vertical trace interval, after time $T_3$, the end of the vertical retrace interval, the error voltage 101 is a negative valued but increasing sawtooth voltage 101c. Modulator 41 provides horizontal rate gating pulses 39 of FIG. 2e of decreasing width, and, as shown in FIGS. 2b and 2f, SCR 32 conducts increasingly later within each horizontal retrace interval. Decreasing amplitude current pulses 103 flow through SCR 32 to charge capacitor 31 positively, as shown in FIG. 2g. It should be noted that, although modulator 41, as illustrated in FIGS. 2c – 2f, provides for conduction of only SCR 32 at the beginning of the vertical trace interval and conduction of only SCR 33 at the end, switched vertical deflection circuit 30 may be operated with both SCR 32 and 33 conducting for overlapping periods within each vertical trace interval. The amount of overlap will, for example, determine the extent of side pincushion correction accomplished, as explained in the aforementioned U.S. Patent Application.

Coupled between vertical sawtooth generator 49 and input terminal C of modulator 41 is an RC differentiating circuit comprising a capacitor 50 and resistors 27–29, capacitor 50 being coupled in parallel with series coupled capacitor 47 and resistor 48. At the start of the vertical retrace interval, time $T_1$ of FIG. 2a, sawtooth voltage 46 decreases abruptly to a lower value. The differentiating circuit adds an additional negative component 101b of FIG. 2a to the error voltage 101 at input terminal C. This additional component ensures that no gating pulses are coupled to SCR 33 during vertical retrace, maintaining the SCR nonconducting during that interval. The time constant for the differentiating circuit is selected such that the duration of the negative component 101b of error voltage 101 is approximately equal to the vertical retrace interval, as shown in FIG. 2a.

With SCR 33 nonconducting, resonant retrace begins. As shown in FIG. 2g, the envelope of the voltage across capacitor 31 is substantially sinusoidal reaching a maximum at time $T_2$.

As mentioned previously, if during vertical retrace, horizontal deflection circuit 20 is not loaded, the abrupt change from maximum loading at the beginning and end of vertical trace to substantially no loading during vertical retrace may produce undesired oscillations within the horizontal deflection circuit. A feature of the invention is to provide loading of horizontal deflection circuit 20 by the switched vertical deflection circuit 30 during this interval.

Instead of directly coupling gating pulses from modulator 41 to the gate electrode of SCR 32, the gating pulses are coupled through transformer 42. Thus, even though the cathode of SCR 32 becomes increasingly positive during vertical retrace, the gating pulses 39a of FIG. 2e permit SCR 32 to couple horizontal retrace pulses to capacitor 31 independent of the SCR cathode voltage.

As shown in FIG. 2f, the currents through SCR 32 are pulses 103a. Because the vertical retrace voltage across capacitor 31 subtracts from the horizontal retrace pulse voltage 23b, the envelope of current pulses 104 from times $T_1 - T_3$ is inversely related to the vertical retrace voltage envelope of capacitor 31, with waveform 104 reaching a minimum at time $T_2$.

Thus, substantial portions of horizontal retrace pulses 23b are coupled to capacitor 31 during vertical retrace. Substantial loading of horizontal deflection circuit 20 occurs, and undesired oscillations within horizontal deflection circuit 20 are prevented.

As mentioned previously, the additional negative component 101b of error voltage 101 ensures that SCR 33 remains nonconductive during vertical retrace. It also ensures that SCR 32 conducts substantial portions of horizontal retrace pulses 23b. Maintaining SCR 33 nonconductive during vertical retrace is desirable because, at the horizontal frequency, the vertical retrace voltage across capacitor 31 represents a DC voltage that adds to the voltage across secondary winding 24c of horizontal output transformer 24. Because SCR 33 represents a short circuit to capacitor 31 during vertical retrace, any conduction of current through SCR 33 during vertical retrace would decrease the retrace current flowing through vertical deflection winding 26 and increase the possibility of undesired oscillations.

Transformer 42 permits the positive gating pulses 39 and 39a to gate SCR 32 into conduction even when the voltage across capacitor 31 is negative or, although positive, it is rapidly changing towards zero. Improved immunity against kinescope arcing is also provided because the transformer isolates the floating SCR 32 from other television receiver processing circuits.

What is claimed is:

1. A switched vertical deflection system comprising:
a horizontal deflection circuit including first means for generating horizontal rate energy signals;
a vertical deflection winding;
energy storage capacitance means coupled to said vertical deflection winding;
first and second switching means coupled to said first means and said energy storage capacitance means; and
second means coupled to said first and second switching means for switching conductive states of both of said switching means for coupling successively smaller portions of said horizontal rate energy signals to said energy storage capacitance means during a first part of a vertical trace interval and successively larger portions of said horizontal rate energy signals during a second part of said vertical trace interval for developing a vertical deflection current in said vertical deflection winding during said vertical trace interval, said second means causing said first switching means to conduct during a vertical retrace interval for coupling substantial portions of said horizontal rate energy signals to said energy storage capacitance means during said vertical retrace interval for preventing undesired oscillations within said horizontal deflection circuit.

2. A system according to claim 1 wherein said first and second switching means comprise controlled semiconductors, said second means coupling first and second signals to said first and second switching means for switching conductive states of both of said controlled semiconductors.

3. A system according to claim 2 wherein said second means includes transformer means for coupling said first signals to said first switching means.

4. A system according to claim 3 wherein said first switching means comprises a silicon controlled rectifier, a secondary winding of said transformer means coupled between the gate and cathode electrodes of said silicon controlled rectifier.

5. A system according to claim 2 including vertical signal means coupled to said second means for generating a vertical rate signal for modulating said first and second signals at a vertical rate.

6. A system according to claim 5 wherein said vertical signal means includes first circuitry for generating a component of said vertical rate signal that inhibits conduction of said second switching means during said vertical retrace interval.

7. A system according to claim 6 wherein said first circuitry comprises an RC differentiating circuit.

8. A system according to claim 7 wherein the time constant of said differentiating circuit is selected to provide a duration for said component of said vertical rate signal substantially equal to said vertical retrace interval.

9. In a television receiver including a horizontal deflection circuit comprising a horizontal deflection generator and a horizontal output transformer, a switched vertical deflection circuit comprising:

a vertical deflection winding;

energy storage capacitance means coupled to said vertical deflection winding;

first and second controllable switches coupled to said capacitance means and to respective secondary windings of said horizontal output transformer for coupling horizontal retrace signals to said capacitance means; and a modulator coupled to said first and second controllable switches and responsive to a source of vertical rate signals for providing to said controllable switches during said vertical trace interval horizontal rate signals modulated at a vertical rate for varying the amount of each horizontal retrace signal coupled to said capacitance means for generating a vertical deflection current in said vertical deflection winding during said vertical trace interval, said switched vertical deflection circuit substantially loading said horizontal deflection circuit at the beginning and end of said vertical trace interval, said modulator providing signals to said first controllable switch during said vertical retrace interval for coupling said horizontal retrace signals to said capacitance means during said vertical retrace interval for substantially loading said horizontal deflection circuit during said retrace interval for preventing undesired oscillations within said horizontal deflection circuit.

10. A circuit according to claim 9 wherein said vertical rate signals cause said modulator to provide for conduction of said first controllable switch during said vertical retrace interval and for inhibiting conduction of said second controllable swith during said vertical retrace interval.

* * * * *

UNITED STATES PATENT AND TRADEMARK OFFICE
CERTIFICATE OF CORRECTION

PATENT NO. : 4,096,415
DATED : June 20, 1978
INVENTOR(S) : Peter Eduard Haferl

It is certified that error appears in the above-identified patent and that said Letters Patent is hereby corrected as shown below:

Column 6, line 41, that portion reading "swith" should read -- switch --.

Signed and Sealed this

Sixteenth Day of January 1979

[SEAL]

Attest:

RUTH C. MASON
Attesting Officer

DONALD W. BANNER
Commissioner of Patents and Trademarks